United States Patent
Chowdhury et al.

(10) Patent No.: US 11,881,375 B2
(45) Date of Patent: Jan. 23, 2024

(54) COMMON SUBSTRATE AND SHADOW RING LIFT APPARATUS

(71) Applicant: Applied Materials, Inc., Santa Clara, CA (US)

(72) Inventors: Abhishek Chowdhury, Bangalore (IN); Nataraj Bhaskar Rao, Bangalore (IN); Siqing Lu, Santa Clara, CA (US); Ravikumar Patil, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 455 days.

(21) Appl. No.: 17/232,078

(22) Filed: Apr. 15, 2021

(65) Prior Publication Data

US 2022/0336182 A1 Oct. 20, 2022

(51) Int. Cl.
| | | |
|---|---|---|
| *H01J 37/08* | (2006.01) | |
| *H01J 37/32* | (2006.01) | |
| *H01J 37/24* | (2006.01) | |
| *H01J 37/248* | (2006.01) | |

(52) U.S. Cl.
CPC ............ *H01J 37/08* (2013.01); *H01J 37/248* (2013.01); *H01J 37/32642* (2013.01); *H01J 2237/24564* (2013.01); *H01J 2237/3328* (2013.01)

(58) Field of Classification Search
CPC .... H01J 37/08; H01J 37/248; H01J 37/32642; H01J 2237/24564; H01J 2237/3328
See application file for complete search history.

(56) References Cited

U.S. PATENT DOCUMENTS

| | | | |
|---|---|---|---|
| 9,960,068 B1 | 5/2018 | Konkola et al. | |
| 10,453,656 B2 | 10/2019 | Carducci et al. | |
| 2005/0263070 A1* | 12/2005 | Fink ................. | H01J 37/32623 118/715 |
| 2015/0122181 A1 | 5/2015 | Okabe et al. | |
| 2019/0122870 A1 | 4/2019 | Ishizawa | |
| 2019/0153592 A1 | 5/2019 | Bois et al. | |
| 2021/0050240 A1 | 2/2021 | Moyama et al. | |

(Continued)

FOREIGN PATENT DOCUMENTS

| | | |
|---|---|---|
| CN | 111508805 A | 8/2020 |
| CN | 112397366 A | 2/2021 |

OTHER PUBLICATIONS

International Search Report for PCT/US2022/024939, dated Aug. 10, 2022.

*Primary Examiner* — Nicole M Ippolito
(74) *Attorney, Agent, or Firm* — MOSER TABOADA (57) ABSTRACT

Embodiments of a lift apparatus for use in a substrate processing chamber are provided herein. In some embodiments, a lift apparatus includes: a plurality of first lift pin assemblies configured to raise or lower a substrate having a given diameter when disposed thereon, wherein each of the first lift pin assemblies includes a first lift pin disposed on a first bellows assembly; a plurality of second lift pin assemblies arranged in a circle having a diameter greater than the given diameter and configured to raise or lower an annular chamber component, wherein each of the second lift pin assemblies includes a second lift pin disposed on a second bellows assembly; an actuator; and a lift assembly coupled to the actuator and configured to raise or lower each of the first lift pin assemblies and the second lift pin assemblies by movement of the actuator.

20 Claims, 7 Drawing Sheets

(56) References Cited

U.S. PATENT DOCUMENTS

2021/0159112 A1\* 5/2021 Kim .................. H01L 21/68735
2022/0336258 A1\* 10/2022 Srivastava ........ H01L 21/68792
2022/0399217 A1\* 12/2022 Marzinotto ....... H01L 21/67259

\* cited by examiner

ND SHADOW
COMMON SUBSTRATE AND SHADOW RING LIFT APPARATUS

FIELD

Embodiments of the present disclosure generally relate to a substrate processing equipment, and more specifically, lift mechanisms for use in substrate processing equipment.

BACKGROUND

Substrate processing systems typically include process chambers for performing a desired process, such as an etch or deposition process, on one or more substrates disposed therein. Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma. A pedestal for supporting the substrate is disposed in the process chamber and may include an electrostatic chuck or vacuum chuck to hold the substrate. The process chamber may include a shadow ring that is disposed about the substrate to protect an edge of the substrate being processed or control plasma in the processing volume of the process chamber.

The substrate is typically transferred into the process chamber via a transfer blade that carries the substrate into the process chamber through an opening in a chamber wall of the process chamber. The process chamber may typically include a substrate lift assembly for raising or lowering the substrate off of or onto the pedestal. The substrate lift assembly generally comprises one or more actuators coupled to one or more substrate lift pins. The process chamber may include a shadow ring lift assembly for raising or lowering the shadow ring within the processing volume. However, separate lift mechanisms for the substrate and the shadow ring can become expensive and crowd a volume below the pedestal.

Accordingly, the inventors have provided improved lift mechanisms for substrates and shadow rings disposed in process chambers.

SUMMARY

Embodiments of a lift apparatus for use in a substrate processing chamber are provided herein. In some embodiments, a lift apparatus includes: a plurality of first lift pin assemblies configured to raise or lower a substrate having a given diameter when disposed thereon, wherein each of the first lift pin assemblies includes a first lift pin disposed on a first bellows assembly; a plurality of second lift pin assemblies arranged in a circle having a diameter greater than the given diameter and configured to raise or lower an annular chamber component, wherein each of the second lift pin assemblies includes a second lift pin disposed on a second bellows assembly; an actuator; and a lift assembly coupled to the actuator and configured to raise or lower each of the first lift pin assemblies and the second lift pin assemblies by movement of the actuator.

In some embodiments, a substrate support for use in a substrate processing chamber includes: a base plate; a dielectric plate coupled to the base plate and having a support surface for supporting a substrate and having one or more chucking electrodes disposed therein; and a lift apparatus comprising: a plurality of first lift pin assemblies having a plurality of first lift pins that extend through the base plate and the dielectric plate to raise or lower a substrate when disposed thereon; a plurality of second lift pin assemblies having a plurality of second lift pins extending through the base plate and configured to raise or lower an annular chamber component disposed above the substrate; an actuator; and a lift assembly coupled to the actuator and configured to raise or lower each of the first lift pin assemblies and the second lift pin assemblies by movement of the actuator.

In some embodiments, a process chamber for processing a substrate includes: a chamber body defining an interior volume therein; a substrate support disposed in the interior volume of the chamber body, wherein the substrate support comprises: a pedestal for supporting the substrate; and a lift apparatus comprising: a plurality of first lift pin assemblies having a plurality of first lift pins extending through the pedestal and configured to raise or lower a substrate; a plurality of second lift pin assemblies having a plurality of second lift pins extending through the pedestal radially outward of the plurality of first lift pins; an actuator; and a lift assembly coupled to the actuator and configured to raise or lower each of the first lift pin assemblies and the second lift pin assemblies by movement of the actuator; and a shadow ring disposed on the plurality of second lift pins.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of lift apparatus for use in process chambers are provided herein. The inventive lift apparatus generally comprises using a common actuator to raise or lower a plurality of first lift pin assemblies for raising or lowering a substrate when disposed thereon and a plurality of second lift pin assemblies for raising or lowering an annular ring when disposed thereon. The annular ring may be a shadow ring, an edge ring, or the like, that is configured to rest on or above the substrate during operation of the process chamber. The lift apparatus is configured to raise the annular ring prior to raising the substrate via a variety of configurations as disclosed herein. By using a common actuator, the lift apparatus is advantageously more cost effective, simpler, and takes up less space in the process chamber.

Figure 1A:
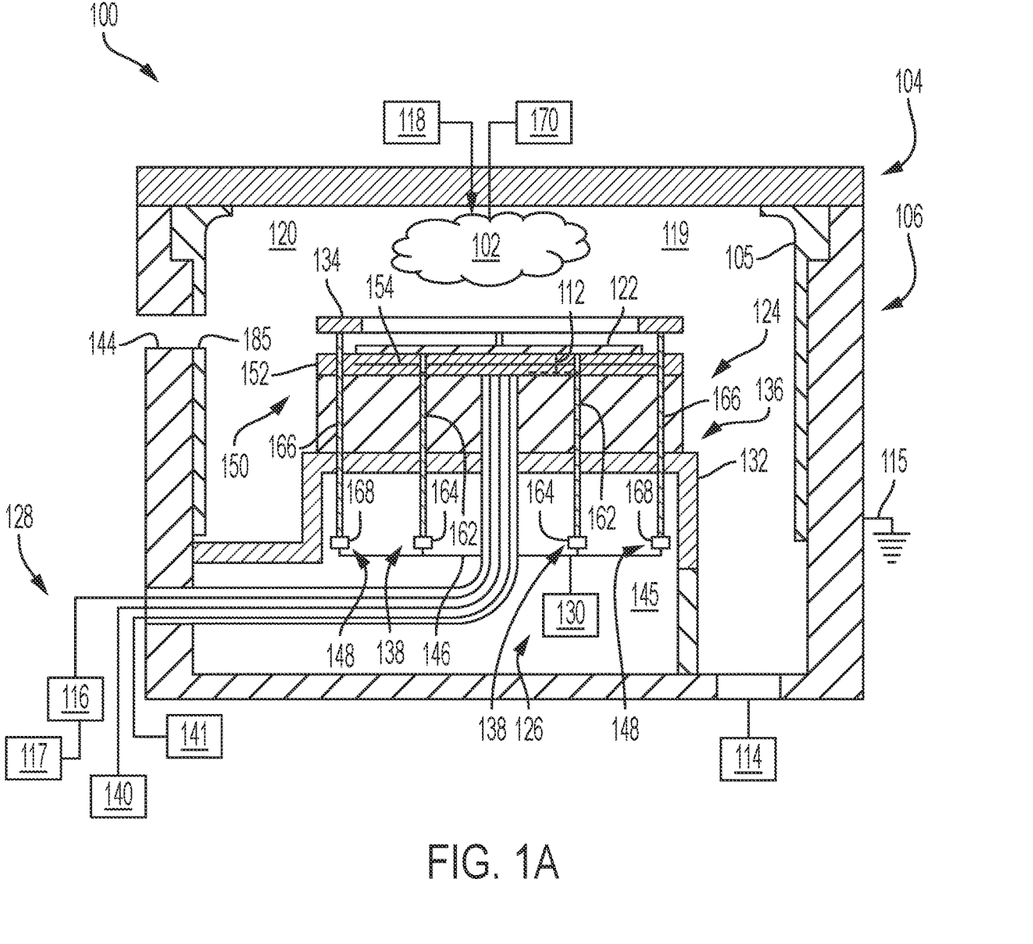
FIG. 1A depicts a schematic side view of a process chamber in a first position in accordance with at least some embodiments of the present disclosure.
Figure 1B:
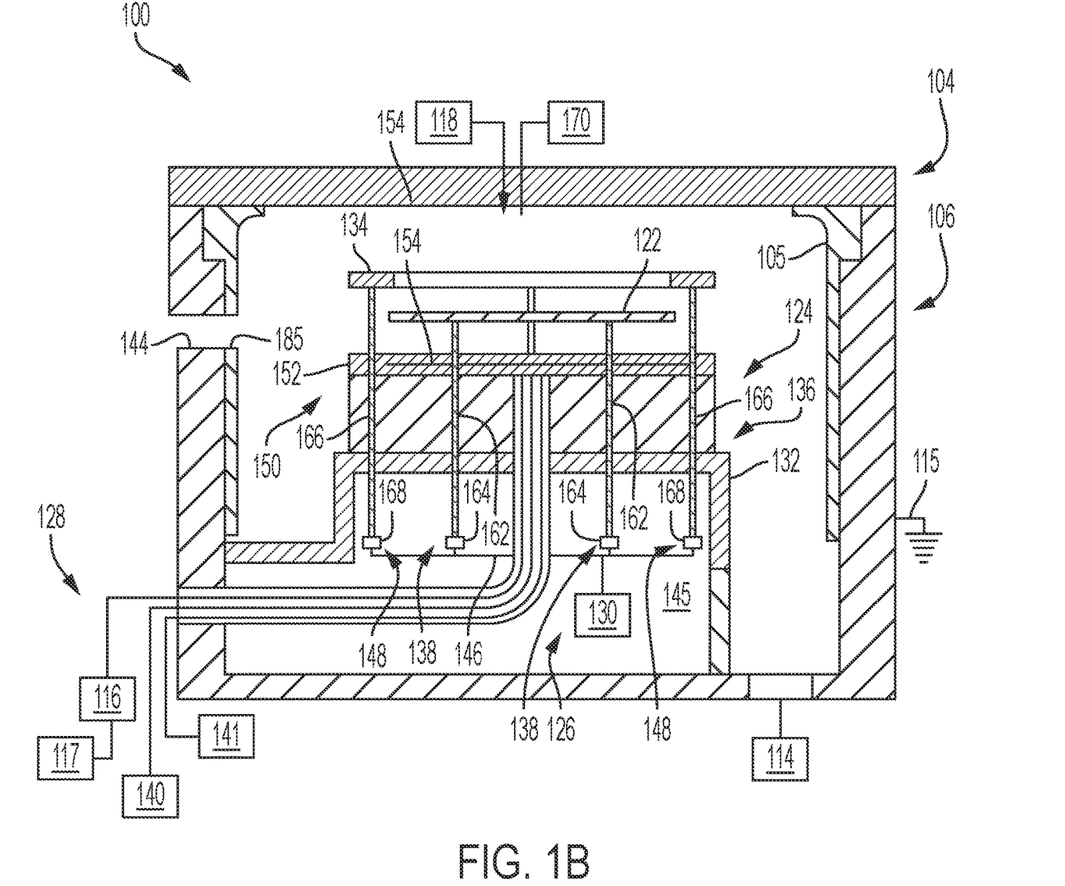
FIG. 1B depicts a schematic side view of a process chamber in a second position in accordance with at least some embodiments of the present disclosure.

FIG. 1A depicts a schematic side view of a process chamber, or chamber 100 in accordance with at least some embodiments of the present disclosure in a first position. FIG. 1B depicts a schematic side view of the chamber 100 in accordance with at least some embodiments of the present disclosure in a second position. In some embodiments, the chamber 100 is an etch processing chamber. However, other types of processing chambers configured for different processes can also use or be modified for use with embodiments of the substrate supports described herein. The chamber 100, is generally a vacuum chamber which is suitably adapted to maintain sub-atmospheric pressures within an interior volume 120 during substrate processing. The chamber 100 includes a chamber body 106 covered by a lid 104 which encloses a processing volume 119 located in an upper portion of the interior volume 120.

A substrate support 124 is disposed within the interior volume 120 to support and retain a substrate 122, such as a semiconductor wafer, for example, or other such substrate as may be electrostatically retained. The chamber body 106 includes a transfer slot 144 to facilitate transferring the substrate 122, or other chamber components, such as a shadow ring 134, into and out of the interior volume 120. The shadow ring 134 is configured to be disposed on or raised slightly above the substrate 122 during processing to protect an edge of the substrate 122 or control plasma proximate an edge of the substrate 122. In some embodiments, a transfer robot (not shown) is configured to transfer the substrate 122. The transfer robot may also advantageously be configured to transfer the shadow ring 134 into and out of the interior volume 120 for replacement.

The chamber 100 may also include one or more shields, such as a process shield 105, circumscribing various chamber components to prevent unwanted reaction between such components and ionized process material, or plasma. In some embodiments, the process shield 105 includes a transfer slot 185 corresponding with a location of the transfer slot 144 in the chamber body 106. In some embodiments, the process shield 105 rests on or is otherwise coupled to the chamber body 106. The chamber body 106 and lid 104 may be made of metal, such as aluminum. The chamber body 106 may be grounded via a coupling to ground 115.

The substrate support 124 may generally comprise a pedestal 150 (described in more detail below with respect to FIG. 2) coupled to the chamber body 106. In some embodiments, as shown in FIG. 1A, the pedestal 150 is fixedly coupled to the chamber body 106. In some embodiments, the pedestal 150 may be movably coupled to the chamber body 106 via a pedestal lift assembly configured to raise or lower the pedestal 150 in the interior volume 120. The pedestal 150 comprises a dielectric plate 152 disposed on a base assembly 136. The dielectric plate 152 includes a support surface for supporting the substrate 122. The dielectric plate 152 includes one or more chucking electrodes 154 configured to electrostatically chuck the substrate 122 to the dielectric plate 152. The pedestal 150 may be coupled to the chamber body 106 via a base plate 132. In some embodiments, the base plate 132, together with the chamber body 106, define a lower volume 145 of the chamber 100. In some embodiments, the lower volume 145 may be at atmospheric pressure during use.

One or more supplies 128 are coupled to the substrate support 124 in any suitable manner through the lower volume 145. For example, the one or more supplies 128 may extend through sidewalls of the chamber body 106, a floor of the chamber body 106, or a combination of the sidewalls or floor of the chamber body 106. In some embodiments, the one or more supplies 128 includes a chucking power supply 140 coupled to the one or more chucking electrodes 154. In some embodiments, the one or more supplies 128 include a backside gas supply 141 to provide a backside gas to an upper surface of the pedestal 150 (i.e., support surface of the dielectric plate 152). The backside gas supply 141 is disposed outside of the chamber body 106 and supplies heat transfer gas to the pedestal 150. The backside gas may consist essentially of helium, nitrogen, argon, or the like. In some embodiments, the one or more supplies 128 includes a bias power supply 117 configured to provide bias power to the pedestal 150. In some embodiments, the bias power supply 117 is coupled to the pedestal via a bias RF match network 116. The bias power supply 117 may include AC, DC, or RF bias power. In some embodiments, the bias power supply 117 may include one or more RF bias power sources.

The substrate support 124 includes a lift apparatus 126 for raising or lowering multiple components disposed above the substrate support 124. The multiple components include the substrate 122 and other annular chamber components. The lift apparatus 126 generally includes an actuator 130 coupled to a plurality of first lift pin assemblies 138 and a plurality of second lift pin assemblies 148 to advantageously lift both the substrate 122 and the shadow ring 134 using a single actuator. In some embodiments, the actuator 130 is a pneumatic actuator. However, in other embodiments, the actuator 130 may be a hydraulic actuator, a servo actuator, or any other suitable type of actuator for use in the chamber 100. In some embodiments, the actuator 130 is a linear actuator.

The plurality of first lift pin assemblies 138 are configured to raise or lower a substrate 122 having a given diameter when disposed on the plurality of first lift pin assemblies 138. Each of the first lift pin assemblies 138 includes a first lift pin 162 disposed on or coupled to a first bellows assembly 164 that is configured to provide a flexible seal that allows vertical movement of the first lift pin 162 while preventing loss of vacuum from within the chamber 100. The first lift pin 162 selectively extends beyond an upper surface of the pedestal 150 to raise the substrate 122 or retract into the pedestal 150 to lower the substrate 122 onto the upper surface of the pedestal 150.

The plurality of second lift pin assemblies 148 are configured to support, raise, or lower the annular chamber component disposed above the substrate support 124, for example, the shadow ring 134. Each of the second lift pin assemblies 148 includes a second lift pin 166 disposed on or coupled to a second bellows assembly 168 that is configured to provide a flexible seal that allows vertical movement of the second lift pin 166 while preventing loss of vacuum from within the chamber 100. In some embodiments, the plurality of second lift pin assemblies 148 are arranged in a circle having a diameter greater than the given diameter. A lift assembly 146 (discussed in more detail below with respect to FIGS. 3-6) is coupled to the actuator 130 and configured to raise or lower each of the first lift pin assemblies 138 and the second lift pin assemblies 148 by movement of the actuator 130. The second lift pin 166 selectively extends beyond an upper surface of the pedestal 150 to raise the shadow ring 134 or retract into the pedestal 150 to lower the shadow ring 134. The pedestal 150 includes through holes to receive the first lift pins 162 and the second lift pins 166.

In the first position, or processing position, the substrate 122 is disposed on the pedestal 150. In the first position, as depicted in FIG. 1A, the shadow ring 134 is disposed in a processing position above the substrate 122. Alternatively, in the processing position, the shadow ring 134 may be lowered to rest on the outer edge of the substrate 122 instead of the second lift pins 166. Either way, in some embodiments, the plurality of second lift pins 166 are configured to extend vertically above the dielectric plate 152 beyond the plurality of first lift pins 162 so that the shadow ring 134 may be lifted before the substrate 122 is lifted to control a vertical spacing of the shadow ring 134 with respect to the substrate 122. In such embodiments, when the second lift pins 166 are retracted into the pedestal 150, there is a gap 112 between the first lift pins 162 and an upper surface of the dielectric plate 152. That is, in some embodiments, the first lift pins 162 are recessed in the pedestal 150 by a distance of the gap 112. In some embodiments, the gap 112 has a distance of about 10 mm to about 30 mm when the first lift pins 162 are fully retracted.

In the second position, or transfer position, as shown in FIG. 1B, the first lift pins 162 are raised above the pedestal 150 and aligned with the transfer slot 144 in the chamber body 106 after being placed in the interior volume 120 or before being removed from the interior volume 121 via the transfer slot 144 by, for example, a robot transfer blade (not shown). In some embodiments, the second lift pins 166 extend vertically higher than the first lift pins 162 also so that the shadow ring 134 does not interfere with the robot transfer blade when transferring the substrate 122 into or out of the interior volume 120. In some embodiments, a vertical distance between a top of the first lift pins 162 and a top of the second lift pins 166 corresponds with a distance of the gap 112.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein. In some embodiments, RF energy is supplied to the processing volume 199 by the RF plasma power supply 170, which may have a frequency of about 400 kHz to over 40 MHz. In some embodiments, the RF plasma power supply 170 is coupled to the chamber 100 via an RF match networks (not shown).

In operation, for example, a plasma 102 may be created in the processing volume 119 to perform one or more processes. The plasma 102 may be created by coupling power from a plasma power source (e.g., RF plasma power supply 170) to a process gas via one or more electrodes near or within the interior volume 120 to ignite the process gas and create the plasma 102. A bias power may be provided from a bias power supply (e.g., bias power supply 117) to the pedestal 150 to attract ions from the plasma 102 towards the substrate 122.

Figure 2:
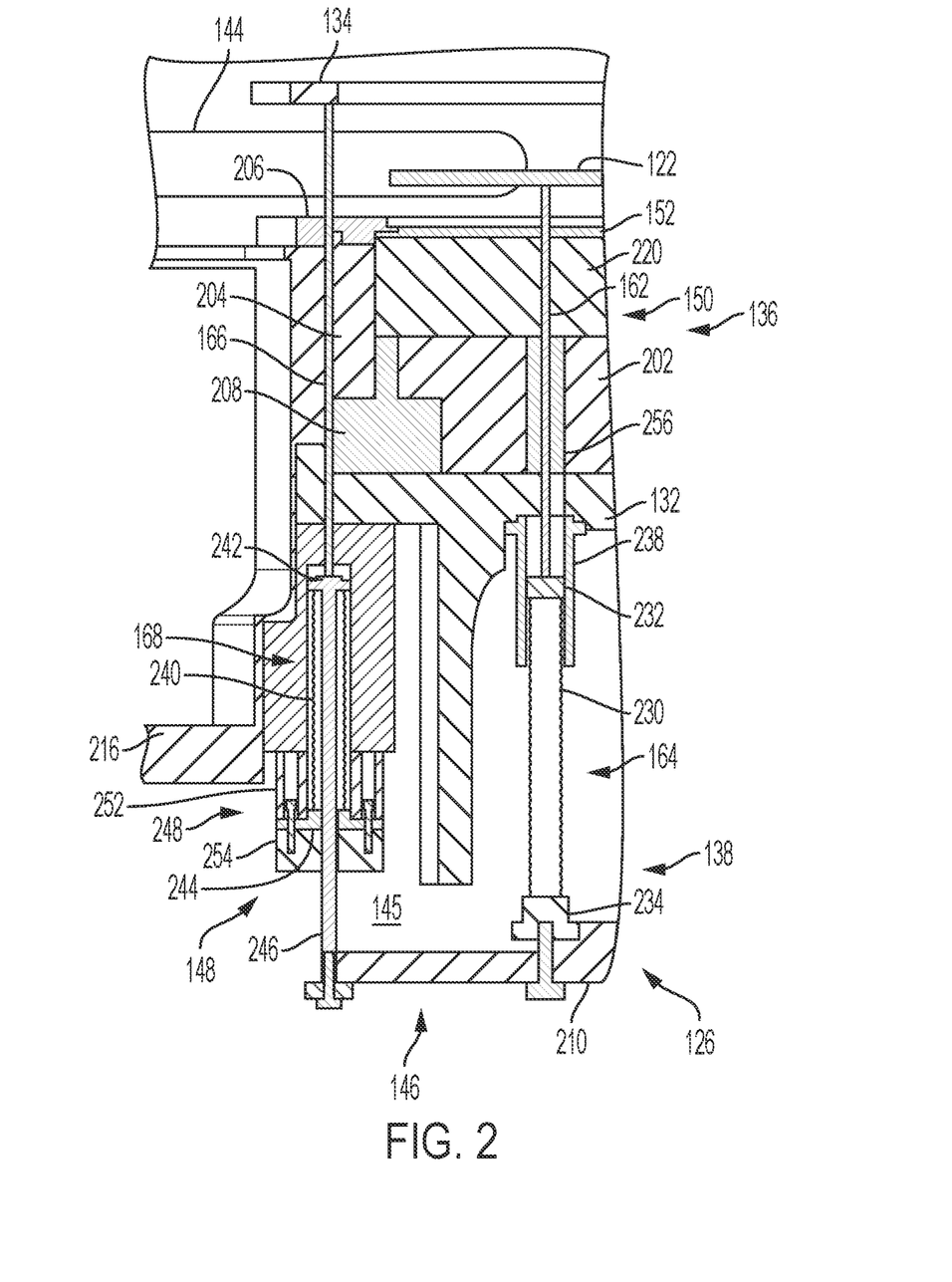
FIG. 2 depicts a schematic side view of a portion of a lift apparatus in accordance with at least some embodiments of the present disclosure.

FIG. 2 depicts a schematic side view of a portion of a lift apparatus 126 in accordance with at least some embodiments of the present disclosure. The portion depicted in FIG. 2 shows one of the plurality of first lift pin assemblies 138 extending through the pedestal 150 to support the substrate 122 and one of the plurality of second lift pin assemblies 148 extending through the pedestal 150 to support the shadow ring 134. In some embodiments, the lift assembly 146 includes a first lifter 210 coupled to the plurality of first lift pin assemblies 138 and the plurality of second lift pin assemblies 148. The first lifter 210 may be a single rigid structure such that a vertical displacement of the lift assembly 146 by a first distance vertically displaces the plurality of first lift pin assemblies 138 and the plurality of second lift pin assemblies 148 by the first distance.

In some embodiments, the substrate support 124 may include a liner 216 disposed about the pedestal 150. In some embodiments, one or more of the liner 216 and the base plate 132 are grounded during use. In some embodiments, the base assembly 136 of the pedestal 150 includes an insulator plate 202 disposed on the base plate 132 to electrically isolate the base plate 132 from the cooling plate 220. In some embodiments, the base assembly 136 includes a cooling plate 220 disposed on the insulator plate 202 and configured to circulate a coolant through the cooling plate 220. In some embodiments, the dielectric plate 152 is disposed on the cooling plate 220.

In some embodiments, the substrate support 124 includes an edge ring 206 disposed about the dielectric plate 152 to extend a process environment radially outward of the substrate 122 to enhance etch uniformity across the substrate 122. In some embodiments, a second edge ring 204 is disposed about the cooling plate 220. In some embodiments, the second edge ring 204 is disposed about the cooling plate 220 and the insulator plate 202. In some embodiments, the edge ring 206 is disposed on the second edge ring 204. In some embodiments, the second edge ring 204 is made of a ceramic material such as quartz or aluminum oxide ($Al_2O_3$).

In some embodiments, a third edge ring 208 is disposed between the edge ring 206 and the base plate 132. The third edge ring 208 may be disposed about the insulator plate 202 and be made of a material different than the insulator plate 226 to protect an outer sidewall of the insulator plate 226 from an unintentional plasma discharge. For example, the third edge ring 208 is made of a ceramic material such as aluminum oxide ($Al_2O_3$). In some embodiments, the first lift pins 162 extend through the dielectric plate 152 and one or more of the base plate 132, the insulator plate 202, or the cooling plate 220 to support the substrate 122. In some embodiments, the second lift pins 166 extend through one or more of the base plate 132, the third edge ring 208, the second edge ring 204, or the edge ring 206 to support the shadow ring 134.

Each of the plurality of first lift pin assemblies 138 include the first lift pins 162 disposed on or coupled to a first bellows assembly 164. In some embodiments, the first bellows assembly 164 includes a bellows 230 disposed between a first upper flange 232 and a first lower flange 234. In some embodiments, the first lower flange 234 is coupled to the first lifter 210. In some embodiments, portions (e.g., lower portion of first lift pins 162 and upper portion of first bellows assembly 164) of each of the first lift pin assemblies 138 extend through a first mounting assembly 238 that is coupled to the base plate 132 of the substrate support 124. In some embodiments, the first mounting assembly 238 comprises a hollow tube configured to slidingly engage the first upper flange 232 therein.

Each of the first lift pins 162 may be coupled to or disposed on the first upper flange 232 such that vertical movement of the first upper flange 232 translates into corresponding vertical movement of each of the first lift pins 162. In some embodiments, one or more first bushings 256 (only one shown in insulator plate 202 of FIG. 2) may be disposed in the pedestal 150 about the first lift pins 162 to guide the first lift pins 162 as the bellows 230 are actuated or retracted. For example, the one or more first bushings 256 may extend through the insulator plate 202, the cooling plate 220, and the dielectric plate 152.

Each of the plurality of second lift pin assemblies 148 include the second lift pins 166 disposed on or coupled to a second bellows assembly 168. In some embodiments, the second bellows assembly 168 includes a bellows 240 disposed between a second upper flange 242 and a second lower flange 244. In some embodiments, portions of each of the plurality of second lift pin assemblies 148 extend through a second mounting assembly 248 that is coupled to the base plate 132 of the substrate support 124. In some embodiments, the second mounting assembly 248 is similar to the first mounting assembly 238.

In some embodiments, as shown in FIG. 2, the second mounting assembly 248 comprises an upper bracket 252 coupled to the base plate 132 and a lower bracket 254 coupled to the upper bracket 252. The second lower flange 244 may be clamped between the upper bracket 252 and the lower bracket 254, for example, via fasteners that extend from the upper bracket 252 into the lower bracket 254 or the lower bracket 254 into the upper bracket 252. In some embodiments, the second bellows assembly 168 includes a lift rod 246 that extends through the second mounting assembly 248 and the second lower flange 244. The lift rod 246 may be coupled to the second upper flange 242 at an upper end and coupled to the first lifter 210 at an opposing lower end.

Each of the second lift pins 166 may be coupled to or disposed on the second upper flange 242 such that vertical movement of the second upper flange 242 translates into corresponding vertical movement of each of the second lift pins 166. In some embodiments, one or more second bushings (not shown) may be disposed about the second lift pins 166 to guide the second lift pins 168 as the bellows 240 are actuated or retracted. For example, the one or more second bushings may extend through one or more of the base plate 132, the edge ring 206, the second edge ring 204, or the third edge ring 208.

Figure 3:
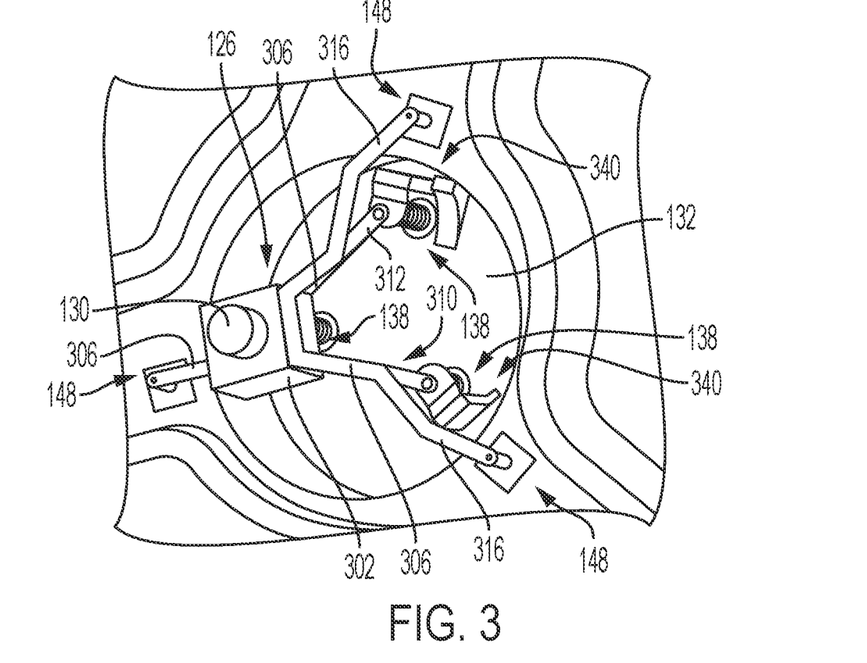
FIG. 3 depicts a bottom isometric view of a lift apparatus in accordance with at least some embodiments of the present disclosure.

FIG. 3 depicts a bottom isometric view of a lift apparatus 126 in accordance with at least some embodiments of the present disclosure. In some embodiments, the lift assembly 146 of the lift apparatus 126 includes a first lifter 210 having a base 302 and a plurality of branches 306 extending from the base 302. In some embodiments, the base 302 is asymmetrically disposed below the pedestal 150. The plurality of branches 306 are coupled to the plurality of first lift pin assemblies 138 and the plurality of second lift pin assemblies 148. In some embodiments, the plurality of first lift pin assemblies 138 comprise three such assemblies. In some embodiments, the plurality of second lift pin assemblies 148 comprise three such assemblies. In some embodiments, all or some of the plurality of first lift pin assemblies 138 and the plurality of second lift pin assemblies 148 may have linear guides 340 coupled to respective ones of the first bellows assembly 164 and the second bellows assembly 168 to guide linear vertical motion.

In some embodiments, one or more of the plurality of branches 306 include a fork 310. In some embodiments, a first prong 312 of the fork 310 is coupled to one of the first lift pin assemblies 138 and a second prong 316 of the fork 310 is coupled to one of the plurality of second lift pin assemblies 148. In some embodiments, the second prong 316 includes one or more bends. In some embodiments, one of the plurality of first lift pin assemblies 138 is coupled to the base 302 of the first lifter 210. For example, in some embodiments, the plurality of branches 306 include two branches that are each coupled to one of the plurality of first lift pins assemblies 138 and one of the plurality of second lift pin assemblies 148, and a third branch of the plurality of branches 306 that is coupled to a third one of the plurality of second lift pin assemblies 148 without being coupled to one of the plurality of first lift pin assemblies 138.

Figure 4:
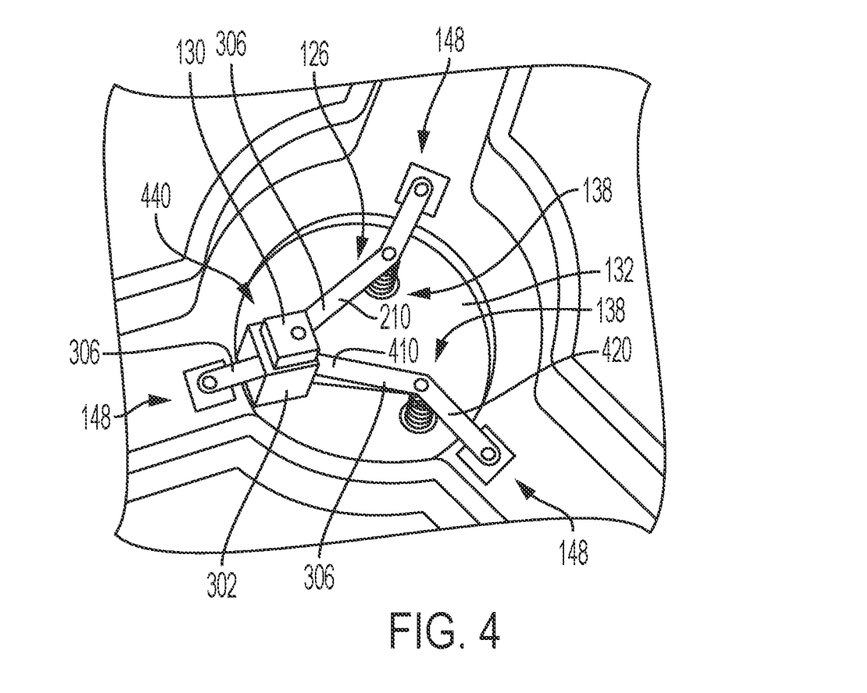
FIG. 4 depicts a bottom isometric view of a lift apparatus in accordance with at least some embodiments of the present disclosure.

FIG. 4 depicts a bottom isometric view of a lift apparatus 126 in accordance with at least some embodiments of the present disclosure. The lift apparatus 126 of FIG. 4 may be similar to the lift apparatus 126 of FIG. 3, except that the plurality of branches 306 of the first lifter 210 of FIG. 4 does not include the fork 310 of FIG. 3. Instead, in some embodiments, one or more of the plurality of branches 306 include a first portion 410 that extends from the base 302 to one of the plurality of first lift pin assemblies 138 and a second portion 420 that extends from the one of the plurality of first lift pin assemblies 138 to one of the plurality of second lift pin assemblies 148. In some embodiments, the first portion 410 does not extend parallel to the second portion 420 along a horizontal plate. In some embodiments, the first portion 410 extends at a first angle from the base 302 along a horizontal plane and the second portion 420 extends at a second angle from the base 302 along the horizontal plate. In some embodiments, the second angle is greater than the first angle. In some embodiments, the lift apparatus 126 may include a common linear guide 440 that interfaces with the base 302 and the plurality of first lift pin assemblies 138 and the plurality of second lift pin assemblies 148 may not interface with any additional linear guides, such as linear guides 340 shown in FIG. 3.

Figure 5:
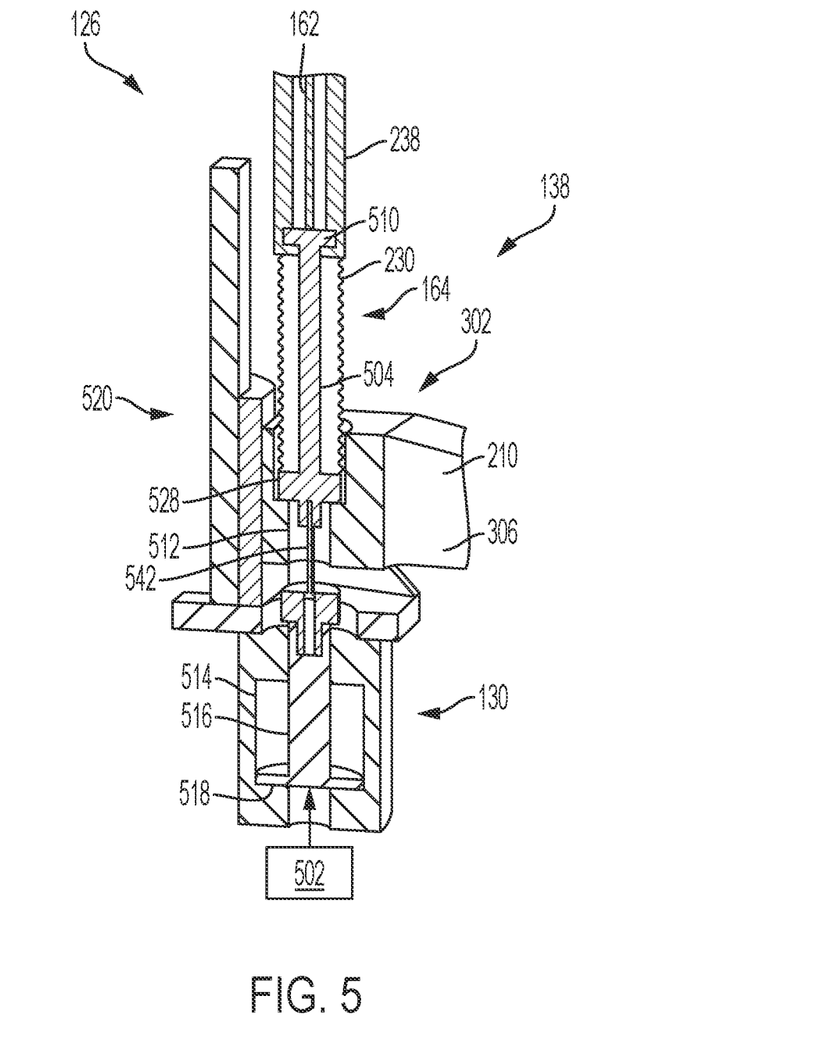
FIG. 5 depicts a cross-sectional view of a portion of a lift apparatus in accordance with at least some embodiments of the present disclosure.

FIG. 5 depicts a cross-sectional view of a portion of a lift apparatus 126 in accordance with at least some embodiments of the present disclosure. In some embodiments, one of the plurality of first lift pin assemblies 138 is disposed above the base 302 of the first lifter 210. In some embodiments, the actuator 130 includes a cavity 514 therein and a shaft 516 that is configured for movement within the cavity 514. For example, in use, a gas source 502 may provide pneumatic pressure to a head 518 of the shaft 516, forcing the shaft 516 upwards. In some embodiments, the base 302 includes an opening 512 therethrough to facilitate coupling the shaft 516 of the actuator 130 to the first bellows assembly 164 in any suitable manner. In such an arrangement, vertical movement of the shaft 516 may translate into vertical movement of one of the first lift pins 162 disposed on or coupled to the first bellows assembly 164.

In some embodiments, the first bellows assembly 164 may include a rod 504 having an upper flange 510 and a lower flange 528. The lower flange 528 may be coupled to the shaft 516 of the actuator 130, for example, via a fastener 542. The upper flange 510 may be disposed within the first mounting assembly 238 and configured for vertical movement therein to move the first lift pin 162. As such, in some embodiments, one of the first lift pins 162 may be aligned with the shaft 516 of the actuator 130.

In some embodiments, a linear guide bracket 520 is coupled to the actuator 130. The linear guide bracket 520 may include slots or protrusions configured to engage with corresponding features of the base 302 of the first lifter 210 to facilitate linear vertical motion of the first lifter 210 and by extension to advantageously facilitate linear vertical motion of all of the plurality of first lift pin assemblies 138 and the plurality of second lift pin assemblies 148

Figure 6:
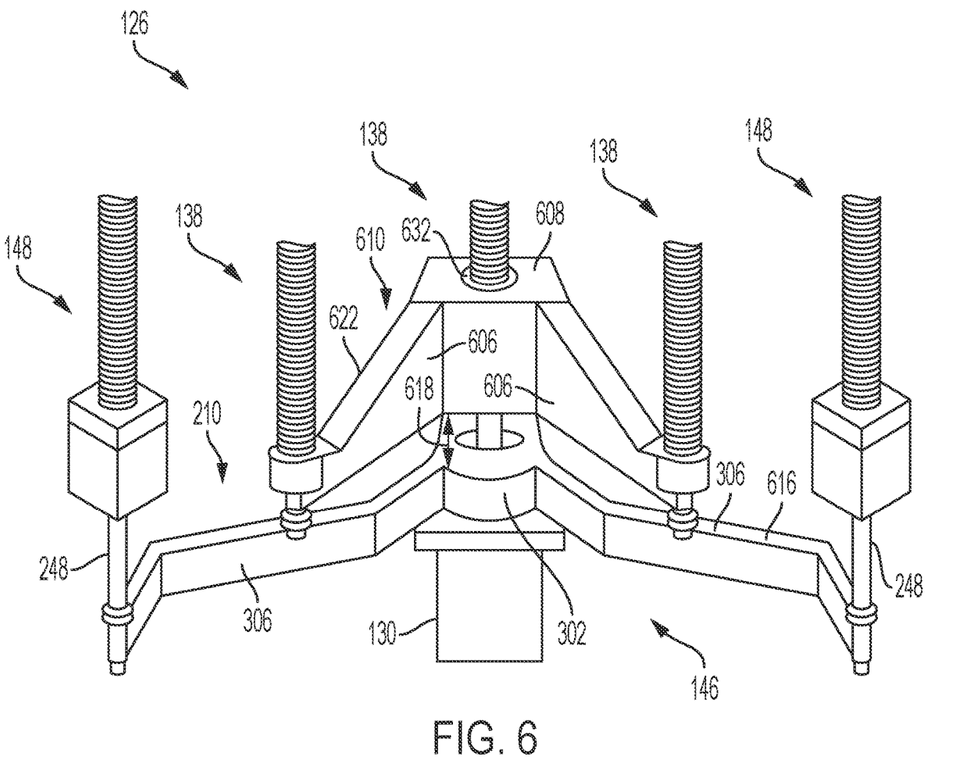
FIG. 6 depicts an isometric view of a portion of a lift apparatus in accordance with at least some embodiments of the present disclosure.

FIG. 6 depicts an isometric side view of a portion of a lift apparatus 126 in accordance with at least some embodiments of the present disclosure. In some embodiments, the lift assembly 146 of the lift apparatus 126 includes a first lifter 210 and a second lifter 610. In some embodiments, the first lifter 210 is coupled to the actuator 130 and each of the plurality of second lift pin assemblies 148. In some embodiments, the second lifter 610 is coupled to each of the plurality of first lift pin assemblies 138. In some embodiments, the second lifter 610 is disposed above the first lifter 210 such that there is a gap 618 between the first lifter 210 and the second lifter 610 when the first lifter 210 is in a lower position, and the first lifter 210 is configured to raise the second lifter 610 when the first lifter 210 is moved to an upper position. In some embodiments, the gap 618 is similar in distance as the gap 112. The two-lifter configuration of FIG. 6 (e.g., first lifter 210 and second lifter 610) advantageously allows for raising of the second lift pins 166 a distance of the gap 618 prior to raising the first lift pins 162. As such, the gap 112 between the first lift pins 162 and an upper surface of the pedestal 150 may be advantageously minimized to reduce the risk of arcing while allowing for the shadow ring 134 to be raised higher than the substrate 122 during use.

The second lifter 610 generally includes a base 608 and one or more branches 606 extending from the base 608. In some embodiments, one of the plurality of first lift pin assemblies 138 is coupled to the base 608 and extends through an opening 632 of the base 608 and two other first lift pin assemblies are coupled at respective ends of two corresponding branches of the one or more branches 606. In some embodiments, an upper surface 622 of the one or more branches 606 of the second lifter 610 taper downward and outward from the base 608. In some embodiments, a lower surface of the second lifter 610 is substantially flat. In some embodiments, an upper surface 616 of the first lifter 210 is substantially flat to advantageously provide a good contact surface with the substantially flat lower surface of the second lifter 610. In some embodiments, the one or more branches 606 may include one or more bends.

Figure 7:
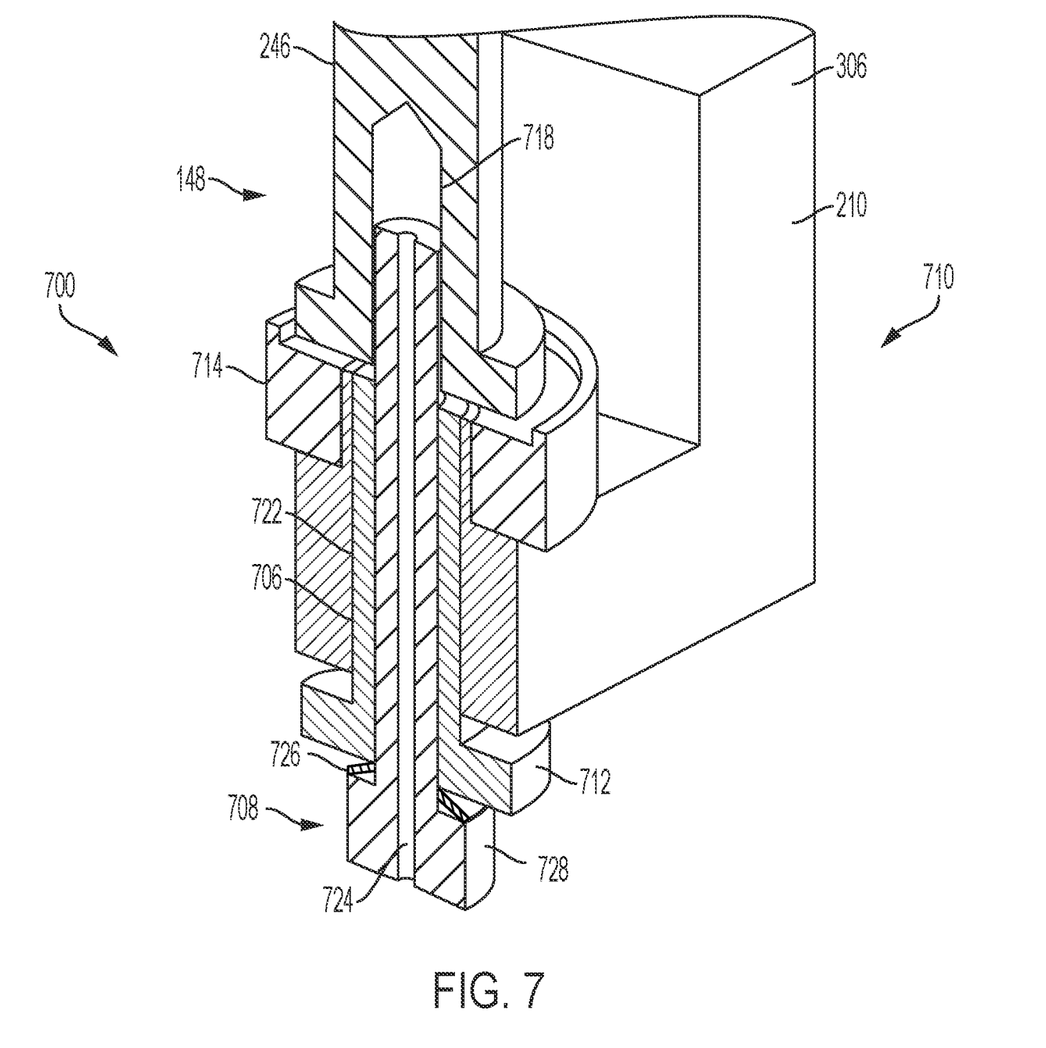
FIG. 7 depicts an isometric cross-sectional view of a connection interface between a lifter and a lift pin assembly in accordance with at least some embodiments of the present disclosure.

FIG. 7 depicts an isometric cross-sectional view of a connection interface 700 between a lifter (e.g., first lifter 210, second lifter 610) and a lift pin assembly (e.g., first lift pin assembly 138, second lift pin assembly 148) in accordance with at least some embodiments of the present disclosure. For example, in some embodiments, the second lift pin assembly 148 is coupled to an end 710 of one of the plurality of branches 306 via a fastener 708. The fastener 708 may extend through the end 710 and into an opening 718 in the lift rod 246 of the second lift pin assembly 148. In some embodiments, the end 710 includes a slot 706 to accommodate the fastener 708. A spacer 712 may be disposed between a lower surface of the end 710 and the head of the fastener 708. In some embodiments, the fastener 708 includes a channel 724 to prevent trapping of air in the opening 718. In some embodiments, the spacer 712 may be a stepped spacer that includes a tubular portion 722 that extends about the fastener through the slot 706.

In some embodiments, a washer 726 may be disposed between the fastener 708 and the lower surface of the end 710, for example, between the spacer 712 and a head 728 of the fastener 708 to advantageously increase rigidity of the connection interface 700 to minimize vibrations between the end 710 and the second lift pin assembly 148. In some embodiments, the washer 726 is configured to bias the head 728 of the fastener 708 against the end 710 when the fastener is tightened, increasing the rigidity of the connection therebetween. The washer 726 may be a simple flat washer, a spring washer, a spring, or the like. For example, the washer 726 may be a conical spring washer or a disc spring washer. In some embodiments, a washer 714 is disposed between the lift rod 246 and an upper surface of the end 710 to increase rigidity of the connection interface 700 and to protect the lift rod 246 during tightening.

While the foregoing is directed to embodiments of the present disclosure, other and further embodiments of the disclosure may be devised without departing from the basic scope thereof.

The invention claimed is:

1. A lift apparatus for use in a substrate processing chamber, comprising:
    a plurality of first lift pin assemblies configured to raise or lower a substrate having a given diameter when disposed thereon, wherein each of the first lift pin assemblies includes a first lift pin disposed on a first bellows assembly;
    a plurality of second lift pin assemblies arranged in a circle having a diameter greater than the given diameter and configured to raise or lower an annular chamber component, wherein each of the second lift pin assemblies includes a second lift pin disposed on a second bellows assembly;
    an actuator; and
    a lift assembly coupled to the actuator and configured to raise or lower each of the first lift pin assemblies and the second lift pin assemblies by movement of the actuator.

2. The lift apparatus of claim 1, wherein the lift assembly includes a first lifter coupled to the first lift pin assemblies and the second lift pin assemblies.

3. The lift apparatus of claim 2, wherein the first lifter includes a base having an opening, and a shaft of the actuator extends into the opening of the base.

4. The lift apparatus of claim 2, wherein the first lifter includes a base and a plurality of branches extending from the base to the first lift pin assemblies and the second lift pin assemblies.

5. The lift apparatus of claim 4, wherein one or more of the plurality of branches include a fork, wherein a first prong of the fork is coupled to one of the first lift pin assemblies, and wherein a second prong of the fork is coupled to one of the second lift pin assemblies.

6. The lift apparatus of claim 4, wherein one or more of the plurality of branches extend from the base to one of the plurality of first lift pin assemblies to one of the plurality of second lift pin assemblies.

7. The lift apparatus of claim 4, wherein one of the plurality of first lift pin assemblies is coupled to the base of the first lifter.

8. The lift apparatus of claim 1, wherein the lift assembly includes a first lifter coupled to each of the second lift pin assemblies and a second lifter disposed above the first lifter and coupled to each of the first lift pin assemblies, wherein there is a gap between the first lifter and the second lifter when the lift assembly is in a lower position, and wherein the first lifter is configured raise the second lifter when the first lifter is moved to an upper position.

9. The lift apparatus of claim 1, further comprising a linear guide bracket coupled to the actuator, and wherein the lift assembly is configured to engage with the linear guide bracket to facilitate linear vertical motion of the lift assembly.

10. A substrate support for use in a substrate processing chamber, comprising:
    a base plate;
    a dielectric plate coupled to the base plate and having a support surface for supporting a substrate and having one or more chucking electrodes disposed therein; and
    a lift apparatus comprising:
        a plurality of first lift pin assemblies having a plurality of first lift pins that extend through the base plate and the dielectric plate to raise or lower a substrate when disposed thereon;
        a plurality of second lift pin assemblies having a plurality of second lift pins extending through the base plate and configured to raise or lower an annular chamber component disposed above the substrate;
        an actuator; and
        a lift assembly coupled to the actuator and configured to raise or lower each of the first lift pin assemblies and the second lift pin assemblies by movement of the actuator.

11. The substrate support of claim 10, wherein the plurality of second lift pins are configured to extend above the dielectric plate beyond the plurality of first lift pins.

12. The substrate support of claim 10, wherein lift assembly includes a first lifter, wherein the first lifter includes a base and a plurality of branches extending from the base, wherein each branch is coupled to one of the second lift pin assemblies.

13. The substrate support of claim 12, wherein the plurality of branches include two branches that are each coupled to one of the first lift pins assemblies and one of the second lift pin assemblies, and a third branch that is coupled to a third one of the plurality of second lift pin assemblies.

14. The substrate support of claim 12, wherein the lift assembly includes a second lifter disposed above the first lifter and having a second base disposed about the actuator and a plurality of second branches coupled to the plurality of first lift pin assemblies, wherein there is a gap between the first lifter and the second lifter when the first lifter is in a lower position, and wherein the first lifter is configured raise the second lifter when the first lifter is moved to an upper position.

15. The substrate support of claim 10, further comprising a cooling plate disposed between the dielectric plate and the base plate.

16. A process chamber for processing a substrate, comprising:
    a chamber body defining an interior volume therein;
    a substrate support disposed in the interior volume of the chamber body, wherein the substrate support comprises:
        a pedestal for supporting the substrate; and
        a lift apparatus comprising:
            a plurality of first lift pin assemblies having a plurality of first lift pins extending through the pedestal and configured to raise or lower a substrate;
            a plurality of second lift pin assemblies having a plurality of second lift pins extending through the pedestal radially outward of the plurality of first lift pins;
            an actuator; and
            a lift assembly coupled to the actuator and configured to raise or lower each of the first lift pin assemblies and the second lift pin assemblies by movement of the actuator; and
    a shadow ring disposed on the plurality of second lift pins.

17. The process chamber of claim 16, wherein the plurality of second lift pins are configured to support the shadow ring above a support surface of the pedestal.

18. The process chamber of claim 16, wherein the lift assembly includes a first lifter having a base and a plurality of branches extending from the base to the plurality of first lift pin assemblies and the plurality of second lift pin assemblies.

19. The process chamber of claim 16, wherein lift assembly includes a first lifter coupled to the plurality of second lift pin assemblies and a second lifter coupled to the plurality of first lift pin assemblies.

20. The process chamber of claim 16, wherein the actuator is a pneumatic actuator.

\* \* \* \* \*